United States Patent
Suh et al.

(10) Patent No.: US 7,629,203 B2
(45) Date of Patent: Dec. 8, 2009

(54) THERMAL INTERFACE MATERIAL FOR COMBINED REFLOW

(75) Inventors: Daewoong Suh, Phoenix, AZ (US); Sabina Houle, Phoenix, AZ (US); Edward A Zarbock, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/059,038

(22) Filed: Mar. 31, 2008

(65) Prior Publication Data

US 2009/0244850 A1    Oct. 1, 2009

(51) Int. Cl.
 *H01L 21/00* (2006.01)
 *H05K 7/20* (2006.01)

(52) U.S. Cl. ............... 438/122; 438/238; 438/614; 257/71; 257/E21.077; 257/E21.083; 257/707; 361/704; 361/719; 29/840

(58) Field of Classification Search ............ 257/71, 257/707, 713, 706, 712, E21.077, E21.084; 361/704, 705, 719; 438/122, 238, 614, 641; 502/150, 155, 162, 493
See application file for complete search history.

(56) References Cited

U.S. PATENT DOCUMENTS

| | | | |
|---|---|---|---|
| 7,164,585 B2 * | 1/2007 | Jadhav et al. | 361/705 |
| 2005/0145846 A1 * | 7/2005 | Brandenburger | 257/71 |
| 2006/0227510 A1 * | 10/2006 | Fitzgerald et al. | 361/704 |
| 2006/0275952 A1 * | 12/2006 | Gowda et al. | 438/122 |
| 2006/0293172 A1 * | 12/2006 | Rubinsztajn et al. | 502/155 |

\* cited by examiner

*Primary Examiner*—Victor A Mandala
*Assistant Examiner*—Whitney Moore
(74) *Attorney, Agent, or Firm*—Cool Patent, P.C.; Joseph P. Curtin

(57) ABSTRACT

A combined thermal interface material and second layer interconnect reflow material and method are disclosed.

22 Claims, 3 Drawing Sheets

TABLE 1

| Alloy Composition (wt %) | Liquidus (°C) | Thermal Conductivity $W.m^{-1}.K^{-1}$ |
|---|---|---|
| Sn/xAu (x = 80.0 wt.%) | 280.0 | $47.0<K<73.0$ |
| Sn/xCu (x=1.2 – 1.75 wt.%) | $245.0<Tm<280.0$ | $47.0<K<73.0$ |
| Sn/xAg (x= 5.0 – 7.0 wt.%) | $245.0<Tm<280.0$ | $47.0<K<73.0$ |
| Sn/xAg/yCu (x= 5.0 -7.0 wt.% and y= 1.2- 1.75 wt.%) | $245.0<Tm<280.0$ | $47.0<K<73.0$ |
| Sn/xNi (x=0.5 to 1.0 wt.%) | $245.0<Tm<280.0$ | $47.0<K<73.0$ |
| Sn/xSb (x=2.0 to 9.4 wt.%) | $245.0<Tm<280.0$ | $47.0<K<73.0$ |
| Pure Sn | 232.0 | $60.0<K<73.0$ |
| Sn/xCu (x= up to 1.2 wt.%) | $227.0<Tm<245.0$ | $47.0<K<73.0$ |
| Sn/xAg (x= up to 5.0 wt.%) | $217.0<Tm<245.0$ | $47.0<K<73.0$ |
| Sn/xNi (x= up to 0.5 wt.%) | $231.0<Tm<245.0$ | $47.0<K<73.0$ |
| Sn/xIn (x=1.0 to 10.0 wt.%) | $220.0<Tm<232.0$ | $47.0<K<73.0$ |
| Sn/xBi (x= up to 12.0 wt.%) | $220.0<Tm<232.0$ | $47.0<K<73.0$ |
| Sn/xAg/yCu (x= up to 5.0 wt.% and y=0.0 to 1.2 wt.%) | $217.0<Tm<245.0$ | $47.0<K<73.0$ |
| Sn/xAg/yCu/z(In or Bi or both) (x = up to 4.5 wt.%, y= 0.0 to 1.0 wt.% and z = <5.0 wt%) | $217.0<Tm<~245.0$ | $47.0<K<73.0$ |

FIG. 2

TABLE 2 - ALLOYING ELEMENTS (mol %)

| Alloy | Cu | Ag | Bi | Zn | In | Ti | Y | Total % | Total Target % for 210 C |
|---|---|---|---|---|---|---|---|---|---|
| Eutectic % | 1.3 | 3.8 | 43 | 14.9 | 51.7 | .5 | 1.6 | | 9.33 |
| Alloy 1 | 1.3 | 3.8 | 2 | 2 | 0.23 | | | 9.33 | |
| Alloy 2 | 1.3 | 3.8 | 4 | | 0.23 | | | 9.33 | |
| Alloy 3 | 1.3 | 3.8 | | 4 | 0.23 | | | 9.33 | |
| Alloy 4 | 1.3 | 3.8 | 2 | 0.23 | 2 | | | 9.33 | |
| Alloy 5 | 1.3 | 3.8 | 1 | 0.23 | 3 | | | 9.33 | |
| Alloy 6 | 1.3 | 3.8 | 3 | 0.23 | 1 | | | 9.33 | |
| Alloy 7 | 1.3 | 3.8 | 0.23 | 2 | 2 | | | 9.33 | |
| Alloy 8 | 1.3 | 3.8 | 0.23 | 1 | 3 | | | 9.33 | |
| Alloy 9 | 1.3 | 3.8 | 0.23 | 3 | 1 | | | 9.33 | |
| Alloy 10 | 1.3 | 3.8 | 1.86 | | 1.87 | 0.5 | | 9.33 | |
| Alloy 11 | 1.3 | 3.8 | 0.6 | | 3.13 | 0.5 | | 9.33 | |
| Alloy 12 | 1.3 | 3.8 | 3.23 | 0.5 | | 0.5 | | 9.33 | |
| Alloy 13 | 1.3 | 3.8 | | 0.5 | 3.23 | 0.5 | | 9.33 | |

FIG. 3

THERMAL INTERFACE MATERIAL FOR COMBINED REFLOW

BACKGROUND

Integrated circuit (IC) dice tend to be fragile and are typically packaged for protection from physical damage and for heat dissipation. ICs may comprise one or more passive and/or active elements, one or more layers of metal interconnects and one or more layers of dielectric material. An IC die and package are typically electrically interconnected via a first level interconnect (FLI) such as, for instance, by wirebonding or soldering. A second level interconnect (SLI) typically couples a package and the printed circuit board via a land, pin or ball grid array.

Operation of integrated circuits generates heat which may have a negative impact on reliability. Heat may be transferred away from an IC die by a thermal dissipation device (TDD), such as an integrated heat spreader (IHS). A TDD may be coupled to an inactive side of an IC die during packaging. Package assembly typically involves repeated thermal cycles which may induce thermomechanical stresses on the package assembly. Attachment of a TDD typically requires an additional thermal cycle to facilitate physical and thermal attachment of the TDD to an IC via a thermal interface material (TIM). A TDD is typically attached using clips, clamps or springs to control tension, position the TDD and to control bond line thickness (BLT). Clips, clamps or springs may increase thermomechanical stress on an IC. Such thermomechanical stress may cause physical damage to the integrated circuit and components of the package assembly resulting in device failure.

BRIEF DESCRIPTION OF THE DRAWINGS

FIG. 2 is a table showing a variety of examples of materials capable of acting as thermal interface materials in a combined reflow process.

FIG. 3 is a table showing a variety of examples of alloying elements to use in a thermal interface material in a combined reflow process.

DETAILED DESCRIPTION

Figure 1:
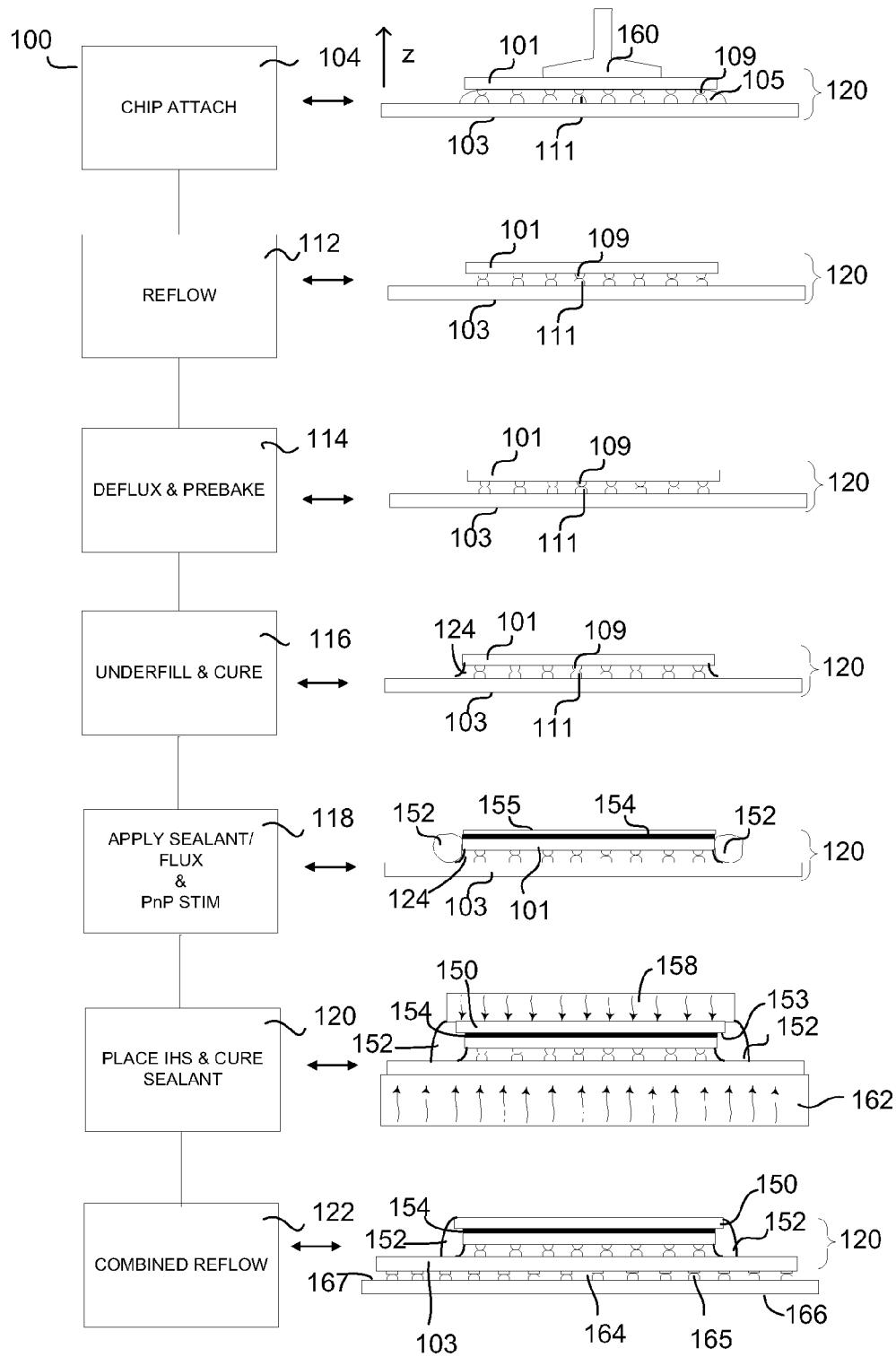
FIG. 1 is a block diagram depicting a particular embodiment of a combined thermal interface material and second layer interconnect reflow process.

In the following detailed description, numerous specific details are set forth in order to provide a thorough understanding of claimed subject matter. However, it will be understood by those skilled in the art that claimed subject matter may be practiced without these specific details. In other instances, well-known methods, procedures, and components have not been described in detail so as not to obscure claimed subject matter.

While the following detailed description describes example embodiments of arrangements to attach a single thermal dissipation device to a backside of a single integrated circuit, claimed subject matter is not limited to such embodiments. For instance, embodiments wherein multiple thermal dissipation devices may be attached to one or more integrated circuits are contemplated and fall within the scope of the following disclosure. Additionally, embodiments described herein refer to a controlled collapse chip connector (C4) flip-chip ball grid array (FC-BGA) package. However, the following disclosure contemplates use with other types of integrated circuit package technologies, such as flip-chip pin grid arrays (FC-PGA), flip-chip land grid arrays (FC-LGA), multiple integrated circuit stack-ups and/or with other types of mounting and packaging technologies. In addition, embodiments of the invention are applicable to a variety of package materials including organic, ceramic, and flex packages.

FIG. 1 is a block diagram depicting a particular embodiment of process 100 for thermally coupling thermal dissipation device (TDD) 150 with an Integrated circuit (IC) 101. Each block is accompanied by a cross-sectional illustration of an assembly 120 comprising components of the package at the process stage referenced by the accompanying block. In a particular embodiment, TDD 150 may be a variety of devices capable of dissipating heat such as a heat spreader, integrated heat spreader and/or heat pipe and claimed subject matter is not limited in this regard. Process 100 discloses a particular embodiment of a C4 FC-BGA packaging technique eliminating a TDD 150 reflow processing stage. However, it will be recognized by those of ordinary skill in the art that process 100 may be adapted to other packaging techniques such as packaging using land grid array and/or pin grid array technologies and claimed subject matter is not so limited.

In a particular embodiment, process 100 may begin at block 104 where solder bumps may be formed and a flux material may be applied. In a particular embodiment, solder may be applied and reflowed to facilitate wetting of bond pads (not shown) to form solder bumps 111. In a particular embodiment, flux material 105 may be applied over a top surface of substrate 103 substantially encapsulating solder bumps 111. However, this is merely an example of a method of solder bump formation and flux application and claimed subject matter is not so limited.

In a particular embodiment, process 100 may proceed to block 104 where IC-substrate attachment may occur. According to a particular embodiment, IC 101 may be positioned over substrate 103 by a pick and place device 160. In a particular embodiment, metal bumps 109 and solder bumps 111 may be aligned. In a particular embodiment, IC 101 may be coupled and/or attached to substrate 103 by a variety of methods such as by compression, adhesion and/or thermocompression to hold the IC 101 and substrate 103 together prior to reflow. In a particular embodiment, flux material 105 may facilitate adhesion between IC 101 and substrate 103. However, this is merely an example of a method of coupling and/or attaching an IC to a substrate and claimed subject matter is not so limited.

Referring still to block 104, in a particular embodiment, IC 101 may comprise a 'thinned die'. According to a particular embodiment, a thinned IC 101 may comprise a thinned profile in the z direction with respect to a full thickness die. Thinning IC 101 may reduce thermomechanical stresses that may be induced during packaging. In a particular embodiment, IC 101 may be wafer-thinned from a full thickness wafer to any thickness less than full thickness. For example, according to a particular embodiment, IC 101 may be thinned from a full thickness of about 775 µm to a thickness of between about 100.0 µm to about 400.0 µm. However, a thinned IC may comprise any other appropriate thickness and claimed subject matter is not so limited.

In a particular embodiment, process 100 may proceed to block 112 where solder reflow may take place. In a particular embodiment, IC 101 and substrate 103 may be electrically interconnected by soldering contacts (not shown) from IC 101 to contacts (not shown) of substrate 103. According to a particular embodiment, during reflow heat may be applied to melt solder bumps 111 by a variety of methods such as, for instance, by contact with a flow of heated gas in a reflow oven, electrical pulse heating and/or direct heat applied by an internal or external heating element and claimed subject matter is not limited in this regard.

In a particular embodiment, process 100 may proceed to block 114 where solder deflux and prebaked may occur. In a particular embodiment, residue from flux 105 may be removed in a deflux stage. Thereafter, according to a particular embodiment, assembly 120 may be prebaked in a prebake oven to remove excess moisture before transfer to an underfill station. However, this is merely an example of a method of removing residue and moisture from an assembly and claimed subject matter is not limited in this regard.

In a particular embodiment, process 100 may proceed to block 116 where underfill 124 may be dispensed and applied to assembly 120 between IC 101 and substrate 103. In a particular embodiment, underfill application may comprise a variety of filling techniques, such as, for instance, capillary underfill, needle injection and/or corner dot underfill and claimed subject matter is not limited in this regard. According to a particular embodiment, underfill 124 may be cured in a curing oven (not shown) to harden underfill 124 and provide support to a first layer interconnect. However, this is merely an example of a method of underfill dispense and cure and claimed subject matter is not so limited.

In a particular embodiment, process 100 may proceed to block 118 where a sealant 152, flux 155 and thermal interface material (TIM) 154 may be applied to assembly 120. According to a particular embodiment, sealant 152 may be dispensed and applied to a top surface of substrate 103. In a particular embodiment, sealant 152 may be applied around a periphery of IC 101. Application of sealant around IC 101 may enable outside perimeter 153 of TDD 150 (shown at block 120) to may make contact with sealant 152 when TDD 150 is positioned over IC 101. In a particular embodiment, sealant 152 may comprise a variety of materials, such as, for instance, silicone and/or other thermoset or thermoplastic adhesives with or without fillers and claimed subject matter is not limited in this regard.

In a particular embodiment, process 100 may continue at block 118 where flux 155 may be applied to a top surface of IC 101. According to a particular embodiment, flux 155 may enable adhesion of TDD 150 to IC 101 prior to reflow. According to a particular embodiment, TIM 154 may be positioned or applied above IC 101. TIM 154 may comprise a variety of materials having a melting point (Tm) in a range from about 210° C. to about 280° C. enabling TIM 154 to remain substantially solid or robust through a combined reflow stage that may reach temperatures in the range of 210° C. to about 300° C.

In a particular embodiment, reflow of TIM 154 may be eliminated at this stage and my occur at a different processing stage. In a particular embodiment, TIM 154 reflow and second layer interconnect reflow may be combined. Eliminating a TIM 154 reflow stage may enable a substantial time and cost savings over conventional methods. A combined reflow stage is discussed in greater detail at block 122.

Referring still to block 118, in a particular embodiment, TIM 154 may be disposed on or above IC 101 by a variety of methods. For instance, TIM 154 may be a preform cut from a thin film foil of the selected TIM 154 material such as materials discussed with reference to FIG. 2 and/or named in Table 1 of FIG. 2. Such a preform may be applied above IC 101 by a pick and place device (not shown). In another particular embodiment, TIM 154 may be applied by dispensing of a paste form of TIM 154 over IC 101. However, these are merely examples of methods of applying TIM 154 to IC 101 and claimed subject matter is not so limited. Materials for use as TIM 154 are discussed in further detail with reference to FIG. 2 below.

In a particular embodiment, process 100 may proceed to block 120 where TDD 150 may be positioned and secured and sealant 152 may be cured. In a particular embodiment, TDD 150 may be positioned by a variety of appropriate methods including by a pick and place device and/or upper chuck 158. In a particular embodiment, if a pick and place device positions TDD 150, TDD 150 may come into contact with upper chuck 158 after placement. In another particular embodiment upper chuck 158 may place TDD 150 over IC 101. According to a particular embodiment, upper chuck 158 may enable thermocompression bonding of TDD 150 to IC 101 by applying heat and pressure to assembly 120. Thermocompression bonding may enable placement and support of TDD 150 over IC 101 without the use of clips, clamps, springs and/or or other additional devices to hold TDD 150 in place over IC 101 prior to reflow.

In a particular embodiment, TDD 150 may be disposed over a top surface of IC 101 on TIM 154 such that a bottom surface of TDD 150 may be in contact with TIM 154. In a particular embodiment, upper chuck 158 may place and may hold TDD 150 over IC 101 while substrate 103 may be held in place by lower chuck 162.

According to a particular embodiment, sealant 152 may be cured by application of heat to sealant 152 conducted through upper chuck 158 and/or lower chuck 162 at a temperature of about room temperature to 150° C. for between about 30 minutes to 24 hours. However, sealant 152 may be cured by a variety of other curing methods such as curing in an oven and/or application of infrared heat and claimed subject matter is not limited in this regard.

In a particular embodiment, process 100 may proceed to block 122 where a combined reflow stage may occur. According to a particular embodiment, combined reflow may comprise reflow of two or more interface and/or solder materials wherein the materials may couple package components using heat applied to interfacing and/or soldering materials. Packaging involves multiple heating and/or reflow stages to enable an interconnection between components and/or for curing package materials. Such thermal cycling induces thermomechanical stress on package components due at least in part to CTE mismatch between components. In a particular embodiment, a combined reflow stage may reduce some of the thermomechanical stress induced by thermal cycling by eliminating a separate TIM 154 reflow stage and thus eliminating a thermal cycle.

Referring still to block 122, during combined reflow, second layer interconnect (SLI) 164 may be formed to establish an electrical interconnection between substrate 103 and PCB 166. Reflowing solder material 165 between substrate 103 and printed circuit board (PCB) 166 may couple electrical contacts (not shown) extending from substrate 103 and PCB 166. Concurrently, TDD 150 and IC 101 may be thermally coupled by reflowing TIM 154 disposed between TDD 150 and IC 101. According to a particular embodiment, solder material 165 may have a melting point in a range of about 210° C. to about 300° C. Therefore, a combined reflow of TIM 154 and solder material 165 may take place at temperatures in the range of about 210° C. to about 300° C.

In a particular embodiment, SLI 164 may comprise a ball grid array (BGA) 170 package. In other particular embodiments, SLI 164 may comprise a variety of other interconnect technologies, such as, for instance, pin grid array and/or land grid array packages and claimed subject matter is not so limited.

In a particular embodiment, to enable a combined reflow stage, TIM 154 may comprise an alloy having a Tm higher than the combined reflow temperature. During combined reflow, TIM 154 alloys having a Tm higher than the combined reflow temperatures may remain solid during reflow, reducing the likelihood of some portion of TIM 154 leaking from the area between IC 101 and TDD 150. Such leakage is referred to as 'squeeze-out'.

In another particular embodiment, TIM 154 may comprise alloys having a Tm lower than the combined reflow temperatures. In a particular embodiment, the degree of squeeze-out increases proportionally with a change in temperature ($\Delta T$) above the Tm because the viscosity of molten metal reduces exponentially with increasing $\Delta T$ above the Tm. However, the $\Delta T$ between the combined reflow temperature and TIM 154's Tm may be selected to keep $\Delta T$ above Tm within a range of about 0° C. to about 30° C. during reflow. Maintaining $\Delta T$ above Tm within the range of about 0° C. to about 30° C. may reduce the likelihood of TIM 154 squeeze-out and may thus enable a combined reflow.

In conventional packaging, thermal interface materials, such as pure Indium typically have a low melting point in the range of 145° C. to about 155° C. For such TIMs, a $\Delta T$ above Tm during a combined reflow may be on the order of >65° C. Such a $\Delta T$ above Tm may increase the likelihood of squeeze out during reflow.

In a particular embodiment, during a combined reflow stage, because thermal coupling between TDD 150 and IC 101 may occur at a higher temperatures than in conventional packaging, a package assembly 120 may be vulnerable to damage due in part to coefficient of thermal expansion (CTE) mismatch between TDD 150 and IC 101. In a particular embodiment, use of a thinned profile IC 101, as discussed previously, may substantially reduce thermomechanical stresses typically caused by CTE mismatch in a full thickness IC 101. A thinned IC 101 die may be made by a variety of methods such as by wafer thinning and/or using low-k dielectric materials for inner layer dielectrics and claimed subject matter is not so limited. Use of a thinned IC 101 may thus enable a combined reflow stage without substantial risk of incurring additional damage to the package assembly 120. However, this is merely an example of a method to reduce thermomechanical stresses during a combined reflow stage and claimed subject matter is not so limited. Further discussion of TIM 154 alloys is presented with reference to FIG. 2.

In FIG. 2, Table 1 provides a variety of alloys for use as thermal interface materials to enable a combined reflow stage as discussed with reference to FIG. 1. In some embodiments, alloys in Table 1 may have good wettability and may be able to thermally couple an integrated circuit with an heat dissipation device. In particular embodiments, the thermal conductivity of some alloys for use in a combined reflow may be higher than conventional thermal interface materials such as polymer thermal interface materials. As discussed previously, suitable alloys may remain solid or resist squeeze-out during combined reflow. Alloys shown in Table 1 are merely examples of alloys having properties capable of enabling a combined reflow stage and claimed subject matter is not limited to the alloys in Table 1.

In FIG. 3, Table 2 provides examples of a variety of alloying elements to use in a thermal interface material. In a particular embodiment, for Sn—X alloys an empirical relationship between Tm and a mol % of alloying elements may be shown, as in Example 1 below. In a particular embodiment, a desired Tm (liquidus temperature) may be selected for a thermal interface material. The formula in Example 1 may be used to derive the amount of alloying element needed to provide an Sn—X alloy having the desired Tm range. In a particular embodiment, a Tm of Sn—X alloy may be independent of specific alloying elements. Rather, it may depend on the total amount of alloying elements added to a base metal.

EXAMPLE 1

$$LT(K) = 499.79 - 7.799M$$

LT=liquidus temperature in degrees Kelvin
M=total amount of alloying element in mol %

A variety of alloying elements capable of bringing an Sn—X alloy within a target Tm of 210° C. are listed in Table 2. With a Tm of 210° C., the total amount of alloying elements (in mol %) is 9.33% based on the formula in Example 1. However, these are merely examples of alloying elements that may be used as a thermal interface material in a combined reflow stage and claimed subject matter is not limited in this regard.

While certain features of claimed subject matter have been illustrated as described herein, many modifications, substitutions, changes and equivalents will now occur to those skilled in the art. It is, therefore, to be understood that the appended claims are intended to cover all such embodiments and changes as fall within the spirit of claimed subject matter.

What is claimed is:

1. A method of forming a package assembly comprising:
   attaching an integrated circuit and a package substrate via a first level interconnect (FLI);
   applying a sealant on a surface of the package substrate;
   disposing a thermal interface material (TIM) on an inactive surface of the integrated circuit wherein the TIM is capable of thermally coupling a heat spreader to the integrated circuit;
   disposing the heat spreader over the TIM;
   curing the sealant;
   forming a second level interconnect (SLI), wherein said forming comprises applying a solder material on a top surface of a printed circuit board (PCB) for attaching the PCB to the package substrate; and
   reflowing the TIM and SLI in a single reflow stage.

2. The method of claim 1 wherein the TIM is a thin film preform and wherein disposing the TIM on an inactive surface of the integrated circuit further comprises picking and placing the TIM preform on the inactive surface of the integrated circuit.

3. The method of claim 1 wherein curing the sealant further comprises applying heat to the sealant through a first chuck coupled to the heat spreader or a second chuck coupled to the package substrate, or combinations thereof.

4. The method of claim 3 wherein the sealant is cured in a temperature range of about room temperature to about 150° C. for about 30 minutes to about 24 hours.

5. The method of claim 3 wherein the sealant is cured at a temperature of about 150° C. for about 30 minutes.

6. The method of claim 1 wherein reflowing further comprises heating the assembly to a temperature in the range of about 210° C. to about 300° C.

7. The method of claim 1 wherein reflowing further comprises heating the assembly to a temperature in the range of about 210° C. to about 245° C.

8. The method of claim 1 wherein reflowing further comprises heating the assembly to a temperature in the range of about 245° C. to about 300° C.

9. The method of claim 1 wherein reflowing further comprises heating the assembly to a temperature of about 230° C.

10. The method of claim 1 wherein reflowing further comprises heating the assembly to a temperature of about 245° C.

11. The method of claim 1 further comprising selecting a TIM, wherein the melting point of the solder material for the SLI is less than or equal to the melting point of the TIM.

12. The method of claim 1 further comprising selecting a TIM, wherein the melting point of the solder material is greater than the melting point of the TIM and wherein the difference between the melting point of the solder material for the SLI and the melting point of the TIM is less than or equal to about 50° C.

13. The method of claim 1 further comprising selecting a TIM, wherein the melting point of the solder material is greater than the melting point of the TIM and wherein the difference between the melting point of the TIM and the melting point of the solder material for the SLI is less than or equal to about 30° C.

14. The method of claim 1 further comprising selecting a TIM, wherein the melting point of the solder material is greater than the melting point of the TIM and wherein the difference between the melting point of the TIM and the melting point of the solder material for the SLI is less than or equal to about 15° C.

15. An integrated circuit package assembly, comprising:
a printed circuit board;
a package substrate coupled to the printed circuit board via a solder material;
an integrated circuit coupled to the package substrate;
a heat spreader couple to an inactive side of the integrated circuit; and
a TIM comprising an alloy disposed between the heat spreader and the integrated circuit wherein;
the TIM and the solder material coupling the package substrate to the printed circuit board are reflowed during a combined reflow operation, the TIM being reflowable at the same temperature as the solder material; and
the melting point of the solder material is less than or equal to 50° C. above the melting point of the TIM.

16. The integrated circuit package assembly of claim 15 wherein the composition of the TIM is; substantially pure Sn, Sn/xAu (x=80.0 wt. %), Sn/xCu (x=1.2-1.75 wt. %), Sn/xAg (x=5.0-7.0 wt. %), Sn/xAg/yCu (x=5.0-7.0 wt. % and y=1.2-1.75 wt. %), Sn/xNi (x=0.5 to 1.0 wt. %), Sn/xSb (x=2.0 to 9.4 wt. %), Sn/xCu (x=up to 1.2 wt. %), Sn/xAg (x=up to 5.0 wt. %), Sn/xNi (x=up to 0.5 wt. %), Sn/xIn (x=1.0 to 10.0 wt. %), Sn/xBi (x=up to 12.0 wt. %) or Sn/xAg/yCu/z (In or Bi or both) (x=up to 4.5 wt. %, y=0.0 to 1.0 wt. % and z=<5.0 wt. %), or combinations thereof.

17. The integrated circuit package of claim 15 wherein the integrated circuit comprises a thinned profile.

18. The integrated circuit package of claim 15 wherein the heat spreader is disposed over the integrated circuit independent of clips, clamps or springs.

19. The integrated circuit package of claim 15 wherein the alloy comprises:
tin as a base metal;
one or more alloying elements wherein the alloying elements comprise copper, silver, bismuth, zinc, indium, titanium or yttrium, or combinations thereof and
wherein the total molar percentage (M) of alloying elements in the alloy has the following empirical relationship to the melting point (Tm) of the alloy: $Tm (K)=499.79-7.700 M$.

20. The thermal interface comprising:
a flux material adapted to react with an alloy;
wherein the alloy comprises tin as a base metal and is adapted to be reflowed during a combined thermal interface and second level interconnect reflow and wherein the thermal interface is adapted to experience substantially no squeeze-out during the combined reflow.

21. The thermal interface of claim 20 wherein the alloy further comprises:
one or more alloying elements wherein the alloying elements comprise; copper, silver, bismuth, zinc, indium, titanium or yttrium, or combinations thereof; and
wherein the total molar percentage (M) of alloying elements in the alloy has the following empirical relationship to the melting point (Tm) of the alloy: $Tm (K)=499.79-7.700 M$.

22. The thermal interface of claim 20 wherein the alloy further comprises:
substantially pure Sn, Sn/xAu (x=80.0 wt. %), Sn/xCu (x=1.2-1.75 wt. %), Sn/xAg (x=5.0-7.0 wt. %), Sn/xAg/yCu (x=5.0-7.0 wt. % and y=1.2-1.75 wt. %), Sn/xNi (x=0.5 to 1.0 wt. %), Sn/xSb (x=2.0 to 9.4 wt. %), Sn/xCu (x=up to 1.2 wt. %), Sn/xAg (x=up to 5.0 wt. %), Sn/xNi (x=up to 0.5 wt. %), Sn/xIn (x=1.0 to 10.0 wt. %), Sn/xBi (x=up to 12.0 wt. %) or Sn/xAg/yCu/z (In or Bi or both) (x=up to 4.5 wt. %, y=0.0 to 1.0 wt. % and z=<5.0 wt. %), or combinations thereof.

* * * * *